United States Patent

Aulet et al.

[11] Patent Number: 6,111,442
[45] Date of Patent: Aug. 29, 2000

[54] PHASE-LOCKED LOOP CIRCUIT WITH DYNAMIC BACKUP

[75] Inventors: Nancy Ruth Aulet; Gregory Edward Beers, both of Austin, Tex.

[73] Assignee: International Business Machines Corporation, Armonk, N.Y.

[21] Appl. No.: 09/036,773

[22] Filed: Mar. 9, 1998

[51] Int. Cl.[7] .................................................... H03L 7/06
[52] U.S. Cl. .......................... 327/156; 327/160; 327/162; 331/25; 331/DIG. 2
[58] Field of Search ..................................... 327/156, 160, 327/162; 331/DIG. 2, 25; 375/373, 375, 376

[56] References Cited

U.S. PATENT DOCUMENTS

| | | | |
|---|---|---|---|
| 5,159,279 | 10/1992 | Shenoi et al. | 327/2 |
| 5,161,175 | 11/1992 | Parker et al. | 377/70 |
| 5,220,293 | 6/1993 | Rogers | 331/15 |
| 5,406,590 | 4/1995 | Miller et al. | 375/376 |
| 5,457,428 | 10/1995 | Alder et al. | 331/1 A |
| 5,552,726 | 9/1996 | Wichman et al. | 327/149 |
| 5,561,390 | 10/1996 | Hiiragizawa | 327/147 |
| 5,574,757 | 11/1996 | Ogawa | 375/376 |
| 5,579,353 | 11/1996 | Parmenter et al. | 327/156 |
| 5,864,572 | 1/1999 | Bhagwan | 371/62 |

*Primary Examiner*—Kenneth B. Wells
*Attorney, Agent, or Firm*—Casimer K. Salys; Felsman, Bradley, Vaden, Gunter & Dillon, LLP

[57] ABSTRACT

A phase-locked loop circuit with dynamic backup is disclosed. The phase-locked loop circuit with dynamic backup includes a phase comparator, a lowpass filter, a voltage-controlled oscillator, and a detection circuit. The phase comparator compares an input reference signal and a feedback output signal from an output of the phase-locked loop circuit for generating a voltage signal representing the phase difference between the input reference signal and the feedback output signal. After the voltage signal is filtered by the lowpass filter, the filtered voltage signal is sent to the voltage-controlled oscillator for generating the feedback output signal. Coupled to the phase comparator, the detection circuit detects whether or not the phase-locked loop circuit is in lock with the input reference signal. In response to a determination that the phase-locked loop circuit is not in lock with the input reference signal, the detection circuit directs the input reference signal to bypass the phase comparator, the lowpass filter, and the voltage-controlled oscillator.

14 Claims, 5 Drawing Sheets

PHASE-LOCKED LOOP CIRCUIT WITH DYNAMIC BACKUP

BACKGROUND OF THE INVENTION

1. Technical Field

The present invention relates to an apparatus for synthesizing signals in general, and in particular to a phase-locked loop circuit. Still more particularly, the present invention relates to a phase-locked loop circuit with dynamic backup.

2. Description of the Prior Art

Phase-locked loop ("PLL") circuits are electronic circuits utilized for locking an output signal in phase and frequency with a reference signal. Traditionally, PLL circuits are found in a variety of data communication devices and telecommunication devices for generating a clock signal synchronous to an external clock signal. In recent years, PLL circuits have often been employed in data processing systems and microprocessors for the purpose of generating a local clock signal that is phase-aligned with a reference clock signal generated by a crystal or another PLL circuit. A common reason for utilizing a PLL circuit within a data processing system is that a PLL circuit is able to synthesize a very stable local clock signal having a clock frequency that is typically higher than the reference clock signal.

A conventional PLL circuit includes a phase comparator (or phase detector), a low-pass filter, and a voltage-controlled oscillator (VCO). In general, the phase comparator compares an input reference signal and an output signal from the VCO in order to generate an error signal that is representative of the phase difference between the reference signal and the VCO output signal. In turn, the error signal is filtered and applied to a control input of the VCO for producing the output signal that tracks the phase and frequency of the reference signal.

Typically, both the low-pass filter and the VCO of a PLL circuit employ analog components, and because of these analog components, PLL circuits are notoriously sensitive to environmental influences. In addition, there are also other sources that affect the performance of a PLL circuit, for example, a noisy or missing input reference signal, a noisy or missing output signal, a noisy or insufficient power supply to the PLL circuits, or extraneous noise picked up by the PLL circuit. Quite often, any one or more of the above factors may lead the PLL circuit output signal to lose lock with the input reference signal. For data transmission systems or data processing systems that demand a certain level of reliability, it is desirable that the output signal clock still be available even when the PLL circuit is losing lock. For this reason, it would be desirable to provide a PLL circuit with dynamic backup such that an associated data transmission system or data processing system may still function properly in the event that the PLL circuit loses lock.

SUMMARY OF THE INVENTION

In view of the foregoing, it is therefore an object of the present invention to provide an improved apparatus for synthesizing signals.

It is another object of the present invention to provide an improved phase-locked loop circuit.

It is yet another object of the present invention to provide a phase-locked loop circuit with dynamic backup.

In accordance with a preferred embodiment of the present invention, a phase-locked loop circuit with dynamic backup includes a phase comparator, a lowpass filter, a voltage-controlled oscillator, and a detection circuit. The phase comparator compares an input reference signal and a feedback output signal from an output of the phase-locked loop circuit for generating a voltage signal representing the phase difference between the input reference signal and the feedback output signal. After the voltage signal is filtered by the lowpass filter, the filtered voltage signal is sent to the voltage-controlled oscillator for generating an output signal. Coupled to the phase comparator, the detection circuit detects whether or not the phase-locked loop circuit is in lock with the input reference signal. In response to a determination that the phase-locked loop circuit is not in lock with the input reference signal, the detection circuit directs the input reference signal to bypass the phase comparator, the lowpass filter, and the voltage-controller oscillator.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

Figure 1:
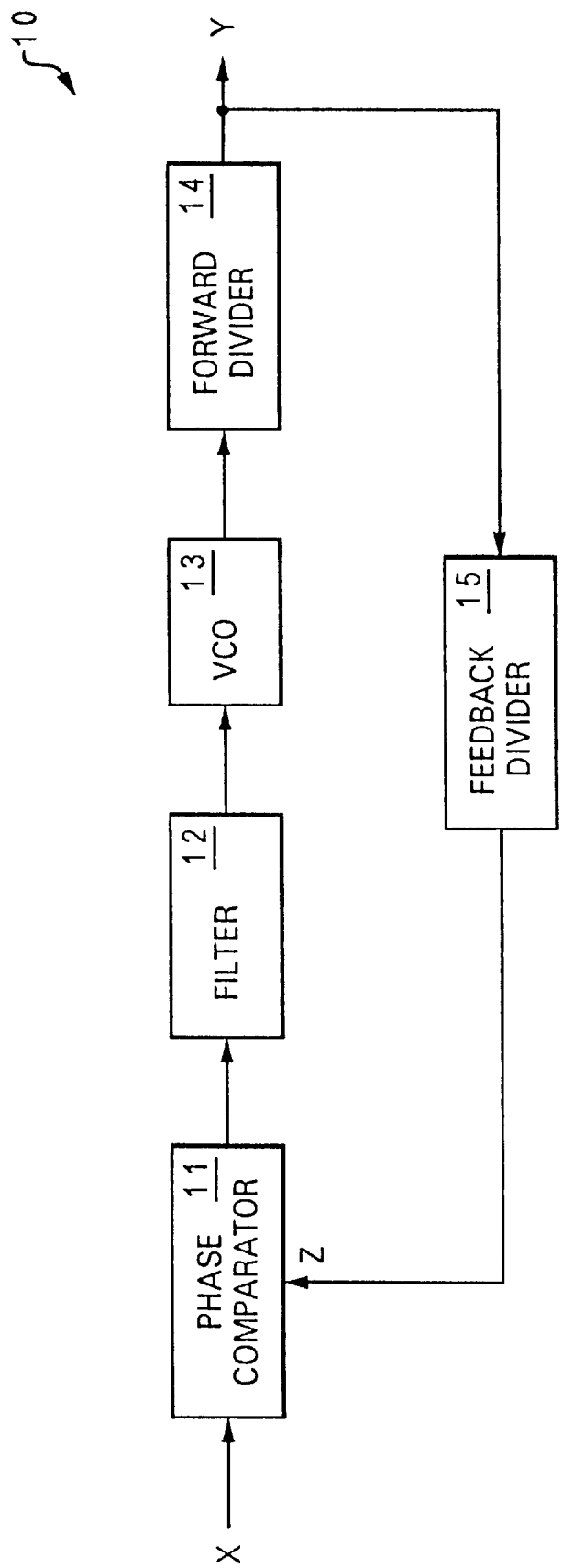
FIG. 1 is a block diagram of a conventional phase-locked loop circuit.

Referring now to the drawings and in particular to FIG. 1, there is depicted a block diagram of a conventional phase-locked loop (PLL) circuit. As shown, PLL circuit 10 includes a phase comparator 11, a lowpass filter 12, a voltage-controlled oscillator (VCO) 13, a forward divider 14, and a feedback divider 15. Phase comparator 11 compares the phases of an input reference signal X and a feedback signal Z to generate a voltage signal representing the phase difference between reference signal X and feedback signal Z. The voltage signal output from phase comparator 11 is then sent to VCO 13 via lowpass filter 12. A division operation is next performed on an output signal generated by VCO 13, utilizing forward divider 14. Forward divider 14 divides the output signal received from VCO 13 by a predetermined value. The output signal Y of forward divider 14 is subsequently sent back to phase comparator 11 via a feedback divider 15 as feedback signal z.

Output signal Y is generated on the basis of reference signal X and feedback signal Z. Sometimes, input reference signal X and feedback signal Z may lose lock. If output signal Y deteriorates, then the system to which PLL circuit 10 is coupled will not function properly. Hence, the idea behind the present invention is that when PLL circuit 10 cannot lock on to reference signal X for whatever reason or loses lock with reference signal X during operation, a detection circuit will detect such a situation and provide an alternate route for furnishing output signal Y to the system in which PLL circuit 10 is being utilized.

Figure 2:
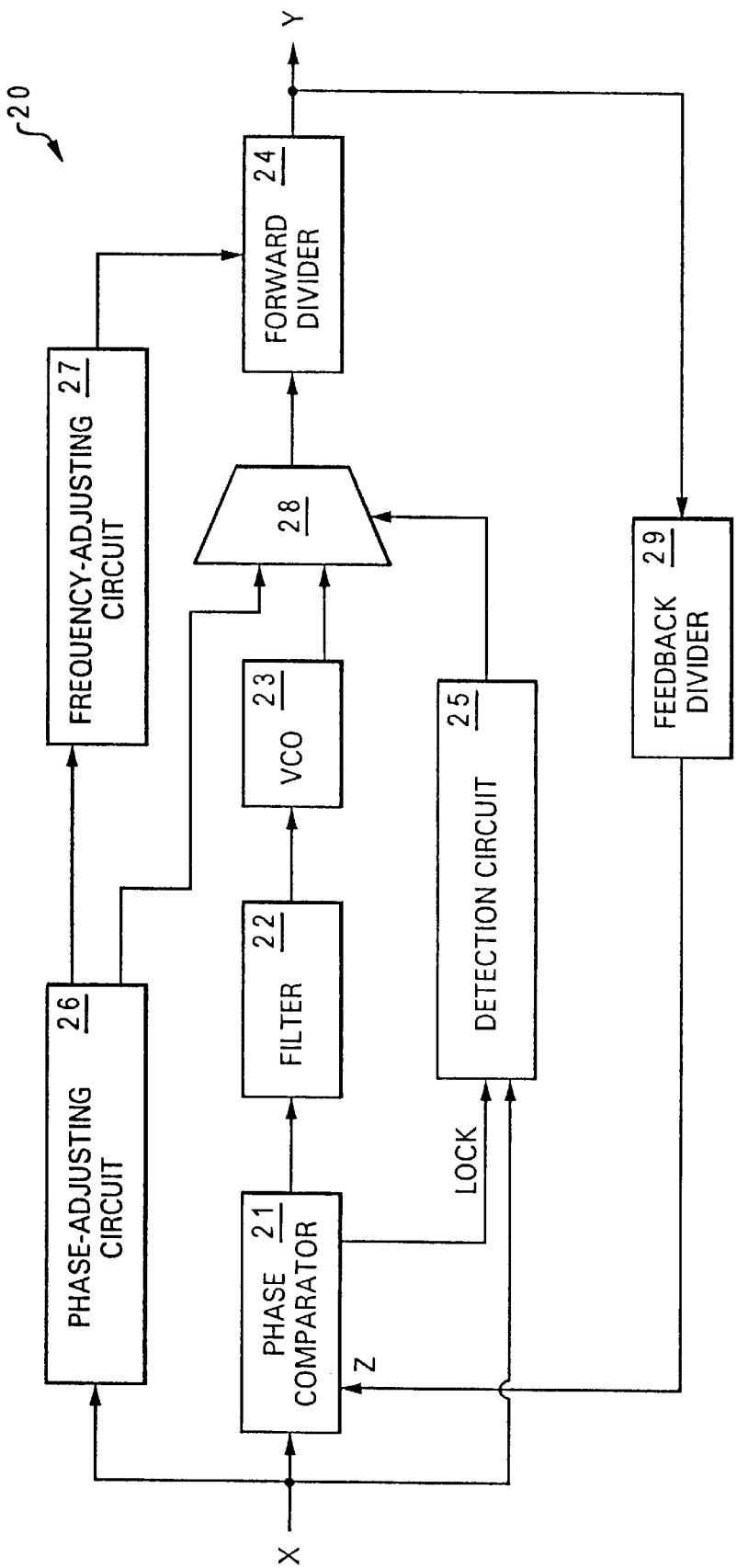
FIG. 2 is a block diagram of a phase-locked loop circuit in accordance with a preferred embodiment of the present invention.

With reference now to FIG. 2, there is depicted a block diagram of a PLL circuit in accordance with a preferred embodiment of the present invention. Similar to the conventional ventional PLL circuit as illustrated in FIG. 1, PLL circuit 20 includes a phase comparator 21, a lowpass filter 22, a VCO 23, a forward divider 24, and a feedback divider 29. But in addition, PLL circuit 20 also includes a detection circuit 25, a phase-adjusting circuit 26, and a frequency-adjusting circuit 27.

During operation, phase comparator 21 compares the phases of an input reference signal X and a feedback signal Z to generate a voltage signal representing the phase difference between reference signal X and feedback signal Z. The voltage signal output generated by phase comparator 21 is then sent to VCO 23 via lowpass filter 22. An output signal generated by VCO 23 is then passed to forward divider 24 via a multiplexor 28. Multiplexor 28, connected between VCO 23 and phase-adjusting circuit 26, is controlled by detection circuit 25. Forward divider 24 divides the output from multiplexor 28 by a predetermined value. Output signal Y generated by forward divider 24 is subsequently sent back to phase comparator 21 via a feedback divider 29 as feedback signal Z.

Figure 3:
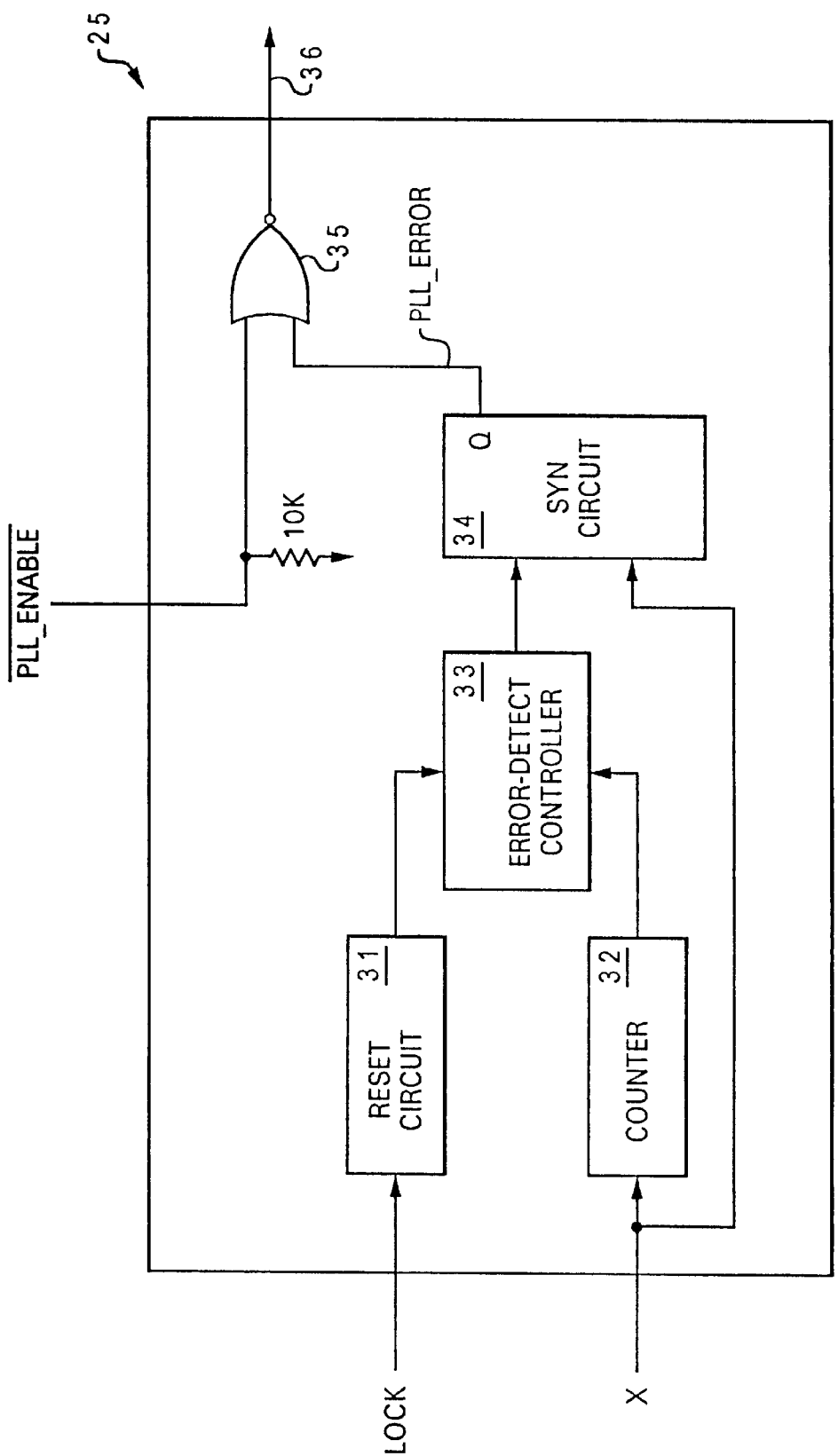
FIG. 3 is a block diagram of the detection circuit from FIG. 2, in accordance with a preferred embodiment of the present invention.

Referring now to FIG. 3, there is depicted a block diagram of detection circuit 25 from FIG. 2, in accordance with a preferred embodiment of the present invention. Detection circuit 25 includes a reset circuit 31, a counter 32, an error-detect controller 33, and a synchronization circuit 34. Reset circuit 31 monitors a LOCK signal generated by phase comparator 21 (from FIG. 2) to determine whether or not the PLL circuit is in lock with reference signal X. Counter 32 ensures error-detect controller 33 will not be triggered during the power-up stage of the PLL circuit. Accordingly, the total count for counter 32 is selected to provide a time delay at least equivalent to, if not greater than, the maximum lock-in time during the power-up stage of the PLL circuit.

Error-detect controller 33 determines whether or not the PLL circuit has locked-in with reference signal X after the power-up, and whether or not the PLL circuit loses lock during the entire operation of the PLL circuit. If error-detect controller 33 determines that the PLL circuit is out-of-lock with reference signal X, a select signal is then sent to multiplexor 28 (in FIG. 2) via output 36 to allow reference signal X to completely bypass the PLL circuit. Referring back to FIG. 2, multiplexor 28, under the control of detection circuit 25, may allow reference signal X to bypass phase comparator 21, lowpass filter 22, and VCO 23. As a result, reference signal X may be directly routed to forward divider 24 for generating output signal Y, in response to a determination that the PLL circuit is out-of-lock with reference signal X. Although this "unconditioned" output signal Y may not be "clean" enough to sustain for long-term system operations, at least a system power-down sequence may be commenced at this time, with the support from "unconditioned" output signal Y, as desired by a system designer. The system power-down sequence, which typically includes a preservation of all current machine states, will probably be helpful for later diagnosis of the problems that cause the out-of-lock situation.

Typically, some form of synchronization is required for the above-mentioned switch from the normal route (i.e., phase comparator 21, lowpass filter 22, and VCO 23) to the alternative route (i.e., phase-adjusting circuit 26) such that no false pulses will be generated by multiplexor 28 and received by forward divider 24 because the loss of lock signal is an asynchronous event. Hence, some form of synchronization is desirable within detection circuit 25 for assisting with the generation of the selected signal to multiplexor 28. As depicted in FIG. 3, synchronization is achieved by a synchronization circuit 34 and a NOR gate 35. NOR gate 35 combines a PLL_ERROR signal from synchronization circuit 34 and a *PLL_ENABLE signal from the PLL circuit to generate the select signal to multiplexor 28. Synchronization circuit 34 is preferably a D flip-flop having reference signal X as a clock input. The select signal is subsequently sent to multiplexor 28 in FIG. 2 via output 36.

Phase-adjusting circuit 26 optimizes any phase shift that may happen during the path switching of input reference signal X from the normal route to the alternative route. As a preferred embodiment of the present invention, phase-adjusting circuit 26 may include a delay equalizer circuit in order to compensate for the delay associated with the normal route. The goal of phase-adjusting circuit 26 is to align the phase of "unconditioned" (bypass) output signal Y with the "original" output signal Y. As mentioned previously, "original" output signal Y is typically in-phase with input reference signal X, but during the bypass mode, phase-adjusting circuit 26 is set to make the delay from input reference signal X to "unconditioned" output signal Y equal to one (or an integer number) clock cycle. (Note: bypass path delay is an aggregation of phase-adjusting circuit 26 delay, multiplexor 28 delay, forward divider 24 delay, and wiring delay).

In a simplest case for input reference signal X having a tight range and/or systems that can tolerate output skew, phase-adjusting circuit 26 may be a constant delay that could be implemented by adding extra pairs of inverters for delay. For more flexibility, the delay element can be programmable, such as a tapped delay line or an analog delay line. An even more elaborate implementation would be using a self-adjusting delay, such as a delay-locked loop (DLL) circuit or another PLL circuit. For example, phase-adjusting circuit 26 may be another PLL circuit—a PLL circuit that offers a way to have a variable delay induced depending on the input clock frequency (the limitation of the example above). If phase-adjusting circuit 26 in FIG. 2 is a PLL circuit with a delay in the feedback equal to the delay through multiplexor 28 and forward divider 24, the bypass clock will be in-phase and as "clean" as the "original" output signal Y over a broad frequency range of input reference signal X.

Because there can be a difference in clock frequency between the normal route and the alternative route, a frequency-adjusting logic 27 is employed to match the frequency of the signal generated by the alternative route to the frequency of signal generated by the normal route. For example, if reference signal X is 100 MHz and the divide ratio of feedback divider 29 is set to /1, then under normal operating conditions, output signal Y will have a frequency of 100 MHz. Forward divider 24 is typically at some divide ratio in order to maintain VCO 23 at a high speed such that VCO 23 is more stable and generates less jitter. For this example, the divide ratio of forward divider 24 is assumed to be /4. If the PLL circuit loses lock and the alternative route is utilized (i.e., via phase-adjusting circuit 26), then output signal Y will be 25 MHz, which is slower than the intended frequency for output signal Y. Thus, the divide ratio of forward divider 24 should be changed to /1 when the alternative route is being utilized. The first and second divide ratios may be selected via a programmable mode bit, and the mode bit can be controlled by frequency-adjusting circuit 27. As such, the divide ratio of forward divider 24 is changed from /4 to /1 in order to maintain output signal Y at a same frequency when the alternative route is being utilized. It is understood by those skilled in the art that the first and second divide ratios may be changed according to the requirements of the system that is coupled to PLL circuit 20.

An optional safeguard circuit may also be added to PLL circuit 10, in accordance with a preferred embodiment of the present invention. This safeguard circuit diagnoses and protects the system that is coupled to PLL circuit 10 from possible overheating should PLL circuit 10 get into a runaway state. Instead of allowing all the internal drivers within the system to be switched at a very high frequency during the runaway state, the safeguard circuit sets the internal drivers to a known DC state. One possible implementation would be placing the internal drivers in a tri-state.

Figure 4:
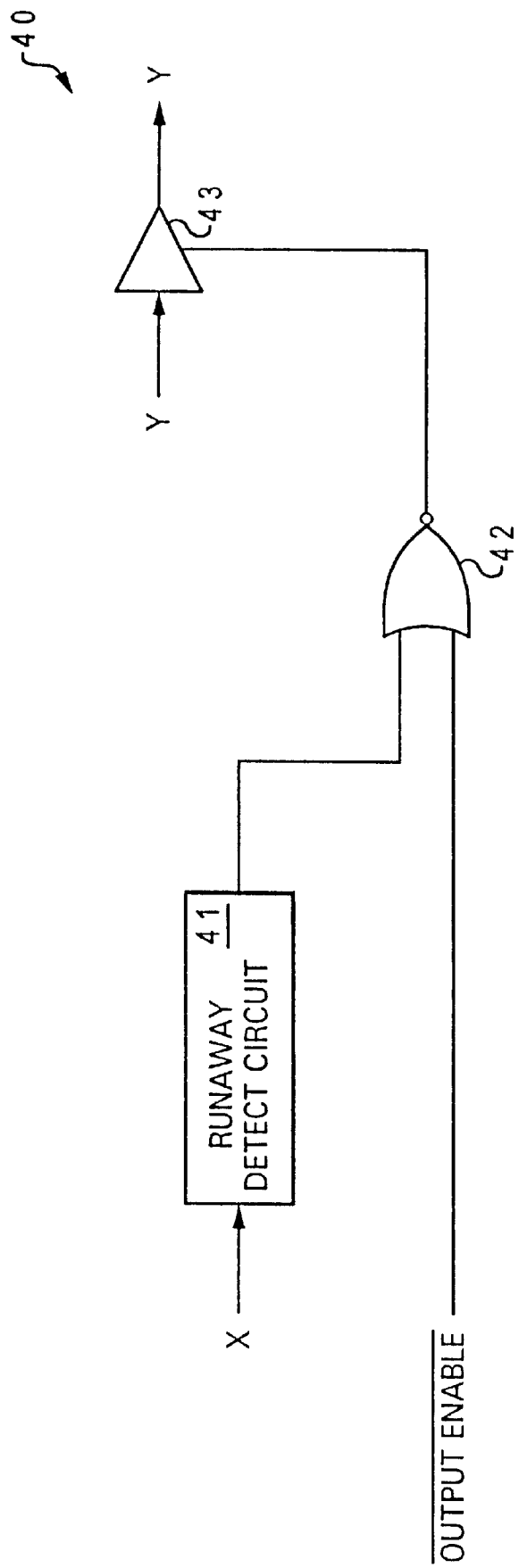
FIG. 4 is a block diagram of a safeguard circuit according to a preferred embodiment of the present invention.

With reference now to FIG. 4, there is depicted a block diagram of a safeguard circuit according to a preferred embodiment of the present invention. Safeguard circuit 40 includes a runaway detection circuit 41, a two-input NOR gate 42, and a tristate buffer 43. The input for NOR gate 42 may include an output from runaway detection circuit 41 and an *OUTPUT ENABLE signal. Runaway detection circuit 41 includes a frequency counter to detect whether or not the frequency of reference signal X has exceeded a maximum allowable input frequency threshold. In addition, runaway detection circuit 41 also includes a self-timed element to define the interval for the frequency counter. During normal operation, output signal Y is allowed to pass through tristate buffer 43; however, if a runaway situation is detected by runaway detection circuit 41, tristate buffer 43 will be placed in a high impedance state such that output signal Y is not allowed to pass through to the system.

Figure 5:
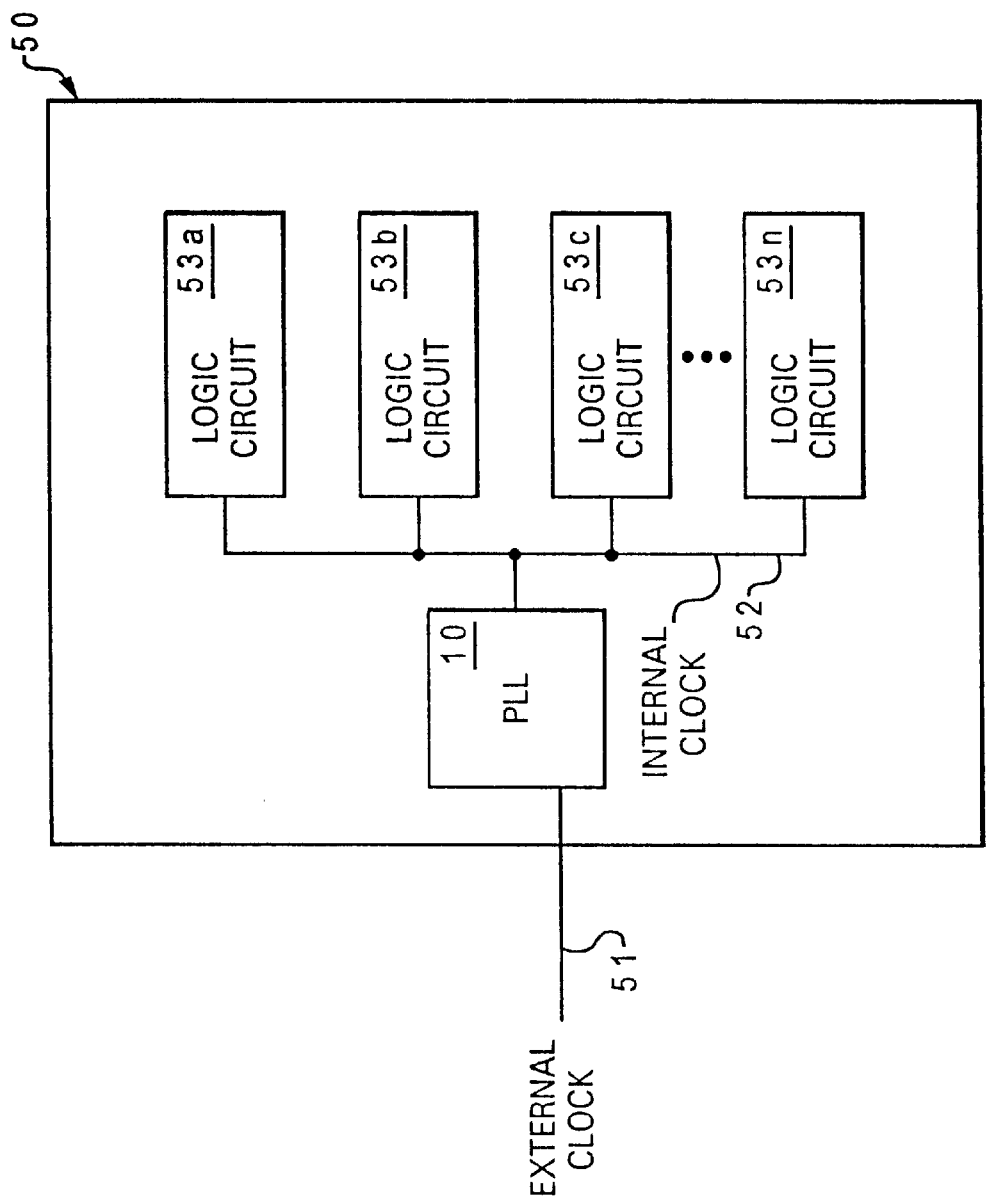
FIG. 5 is an exemplary implementation of a PLL circuit with dynamic backup, in accordance with a preferred embodiment of the present invention.

Referring now to FIG. 5, there is illustrated an implementation of PLL circuit 10, in accordance with a preferred embodiment of the present invention. In this example, PLL circuit 10, embedded within processor 50, is being utilized to provide an internal clock signal 52 in response to receipt of an external clock signal 51. External clock signal 51 may be supplied by a crystal or another PLL circuit. Internal clock signal 52 subsequently fans out to various logic circuits 53a–53n throughout processor 50.

As has been described, the present invention provides a PLL circuit with dynamic backup. In accordance with the present invention an input reference signal is utilized to generate an output signal in order to allow a system coupled to the PLL circuit to continue functioning with normal or degraded performance should the PLL circuit lose lock with the input reference signal. The generation of substitute output signals can permit the system to save its current machine state prior to shut-down, which may be helpful in performing system diagnostics. A safeguard circuit is also described that can prevent a system from severe damage if the PLL circuit breaks down and enters into a runaway state.

While the invention has been particularly shown and described with reference to a preferred embodiment, it will be understood by those skilled in the art that various changes in form and detail may be made therein without departing from the spirit and scope of the invention.

What is claimed is:

1. A phase-locked loop circuit with dynamic backup, comprising:

a phase comparator for comparing an input reference signal and a feedback output signal to generate a voltage signal representing the phase difference between said input reference signal and said feedback output signal;

a lowpass filter, coupled to said phase comparator, for filtering said voltage signal;

a voltage-controlled oscillator, coupled to said lowpass filter, for generating an output signal from said filtered signal;

a detection circuit, coupled to said phase comparator, for detecting whether or not said phase-locked loop circuit is in lock with said input reference signal, wherein said detection circuit directs said input reference signal to bypass said phase comparator, said lowpass filter, and said voltage-controlled oscillator, in response to detecting that said phase-locked loop circuit is not in lock with said input reference signal; and a phase-adjusting circuit for eliminating any phase shifting of said input reference signal during an initiation of said bypass.

2. The phase-locked loop circuit according to claim 1, wherein said detection circuit includes a synchronization circuit for sending a select signal to direct said input reference signal to bypass said phase comparator, said lowpass filter, and said voltage-controlled oscillator.

3. The phase-locked loop circuit according to claim 1, wherein said phase-locked loop circuit further includes a multiplexor connected between said voltage-controlled oscillator and said phase-adjusting circuit, wherein said multiplexor is controlled by said select signal.

4. The phase-locked loop circuit according to claim 2, wherein said phase-locked loop circuit further includes a frequency-adjusting circuit for eliminating any frequency shifting of said input reference signal during said bypass.

5. The phase-locked loop circuit according to claim 4, wherein said frequency-adjusting circuit is further coupled to a frequency divider having multiple divide ratios.

6. A phase-locked loop circuit with dynamic backup, comprising:

a phase comparator for comparing an input reference signal and a feedback output signal to generate a voltage signal representing the phase difference between said input reference signal and said feedback output signal;

a lowpass filter, coupled to said phase comparator, for filtering said voltage signal;

a voltage-controlled oscillator, coupled to said lowpass filter, for generating an output signal from said filtered signal;

a detection circuit, coupled to said phase comparator, for detecting whether or not said phase-locked loop circuit is in lock with said input reference signal based on a LOCK signal generated by said phase comparator;

a multiplexor, coupled to said voltage-controlled oscillator, for multiplexing between said input reference signal and said output signal from said voltage-controlled oscillator, wherein said multiplexor is controlled by said detection circuit to allow said input reference signal to pass through instead of said output signal from said voltage-controller oscillator, in response to said detection circuit detecting that said phase-locked loop circuit is not in lock with said input reference signal; and a phase-adjusting circuit for eliminating any phase shifting of said input reference signal during an initiation of said bypass.

7. The phase-locked loop circuit according to claim 6, wherein said phase-locked loop circuit further includes a frequency-adjusting circuit for eliminating any frequency shifting of said input reference signal during said bypass.

8. The phase-locked loop circuit according to claim 7, wherein said frequency-adjusting circuit is further coupled to a frequency divider having multiple divide ratios.

9. The phase-locked loop circuit according to claim 6, wherein said phase-locked loop circuit further includes a safeguard circuit for preventing a system damage if said phase-locked loop circuit breaks down and enters into a runaway state.

10. A processor having a phase-locked loop circuit as a clock input, comprising:

- a plurality of logic circuits; and
- a phase-locked loop circuit coupled to said plurality of logic circuits, wherein said phase-locked loop circuit includes:
    - a phase comparator for comparing an input reference signal and a feedback output signal to generate a voltage signal representing the phase difference between said input reference signal and said feedback output signal;
    - a lowpass filter, coupled to said phase comparator, for filtering said voltage signal;
    - a voltage-controlled oscillator, coupled to said lowpass filter, for generating an output signal from said filtered signal;
    - a detection circuit, coupled to said phase comparator, for detecting whether or not said phase-locked loop circuit is in lock with said input reference signal, wherein said detection circuit directs said input reference signal to bypass said phase comparator, said lowpass filter, and said voltage-controller oscillator, in response to a detection that said phase-locked loop circuit is not in lock with said input reference signal; and
    - a phase-adjusting circuit for eliminating any phase shifting of said input reference signal during an initiation of said bypass.

11. The processor according to claim 10, wherein said detection circuit includes a synchronization circuit for sending a select signal to direct said input reference signal to bypass said phase comparator, said lowpass filter, and said voltage-controller oscillator.

12. The processor according to claim 10, wherein said phase-locked loop circuit further includes a multiplexor connected between said voltage-controlled oscillator and said phase-adjusting circuit, wherein said multiplexor is controlled by said select signal.

13. The processor according to claim 11, wherein said phase-locked loop circuit further includes a frequency-adjusting circuit for eliminating any frequency shifting of said input reference signal during said bypass.

14. The processor according to claim 13, wherein said frequency-adjusting circuit is further coupled to a frequency divider having multiple divide ratios.

* * * * *